United States Patent [19]

Romano

[11] 4,259,685
[45] Mar. 31, 1981

[54] CLAMP FOR SECURING AN ENCASED POWER FRAME TO A HEAT SINK

[75] Inventor: Luigi Romano, Monza, Italy

[73] Assignee: SGS-ATES Componenti Elettronici S.p.A., Milan, Italy

[21] Appl. No.: 18,638

[22] Filed: Mar. 8, 1979

[30] Foreign Application Priority Data

Mar. 9, 1978 [IT] Italy ............................... 21073/78[U]

[51] Int. Cl.³ .................... H01L 23/02; H01L 23/28; H01L 23/42
[52] U.S. Cl. ........................................ 357/81; 357/79; 357/72; 174/16 HS; 165/80
[58] Field of Search ............... 357/81, 79, 72; 165/80, 165/105; 174/16 HS

[56] References Cited

U.S. PATENT DOCUMENTS

| | | | |
|---|---|---|---|
| 3,548,927 | 12/1970 | Spurling | 357/81 |
| 3,694,703 | 9/1972 | Wilens | 357/81 |
| 3,786,317 | 1/1974 | Thierfelder | 357/81 |
| 4,054,901 | 10/1977 | Edwards et al. | 357/81 |
| 4,095,253 | 6/1978 | Yoshimura | 357/81 |
| 4,100,566 | 7/1978 | Okikawa et al. | 357/81 |

OTHER PUBLICATIONS

IERC Bulletin, A New Dissipator for Double Dip C-MOS Etc., No. 186, Nov. 1976.

Primary Examiner—Andrew J. James
Attorney, Agent, or Firm—Karl F. Ross

[57] ABSTRACT

A semiconductor device, comprising a lead frame connected to an IC chip in a resinous block and a metallic strip projecting unilaterally from that block along a heat sink, is fastened to that heat sink by a screw traversing aligned holes in the projecting strip portion and in an overlying clamp. The latter has a body of resilient sheet metal, such as brass, bent into a casing around the projecting strip portion and a cantilevered tongue overlying the resinous block, a projection on that tongue bearing upon the block under pressure of the fastening screw.

5 Claims, 4 Drawing Figures

CLAMP FOR SECURING AN ENCASED POWER FRAME TO A HEAT SINK

FIELD OF THE INVENTION

My present invention relates to a mounting for a semiconductor device of the type comprising a lead frame connected within a resinous block to an integrated-circuit chip which contacts a metallic strip projecting unilaterally from that block along a heat sink such as, for example, a copper plate.

BACKGROUND OF THE INVENTION

Devices of this type, in which a set of conductors integral with the lead frame project from the resinous body on the side opposite the heat-dissipative metal strip to avoid possible short circuits, are available on the market under the designation TO-220. In such devices or packages, the projecting strip portion has a hole to be penetrated by a screw serving to fasten it to an underlying support serving, especially in the case of a power stage, as a heat sink. Theoretically, the rigid metal strip is flush with the underside of the resin body and is therefore in full-face contact with the heat sink. In practice, however, this strip is not perfectly straight but has undergone some deformation during prior handling so that the pressure exerted by the fastening screw upon the free end of the strip tends to elevate its embedded end above the supporting plate surface. This separation forces the major part of the thermal flux, originating from within the package, to pass along the strip to the vicinity of the fastening screw where the strip is in firm contact with the plate. The resulting increase in the thermal resistance of the flow path necessitates a considerable enlargement of the heat sink, in comparison with the theoretical requirement, for the purpose of effective dissipation of the thermal flux concentrated at the exposed strip portion.

OBJECT OF THE INVENTION

The object of my present invention, therefore, is to provide an improved mounting for semiconductor devices of the aforedescribed type designed to obviate this drawback.

SUMMARY OF THE INVENTION

I realize this object, in accordance with my present invention, by the provision of a clamp which has a body of resilient sheet metal, e.g. brass, forming a four-sided base with legs bent down on three sides to rest on a heat sink supporting the associated semiconductor device. A stepped tongue extending intergrally from the fourth side of the base has a rising part substantially perpendicular to the base and a free extremity substantially parallel thereto, that extremity being provided with a downward projection which is engageable with the device resting on the heat sink. The base has an aperture traversable by a fastener, such as a screw, which may also pass through an aligned hole in the projecting strip portion of the device and engages the substrate to exert pressure upon the base of the clamp whereby the cantilevered tongue overlying the resin block of the device maintains its projection in firm contact with the upper block surface.

BRIEF DESCRIPTION OF THE DRAWING

The above and other features of my invention will now be described in detail with reference to the accompanying drawing in which.

SPECIFIC DESCRIPTION

Figure 1:
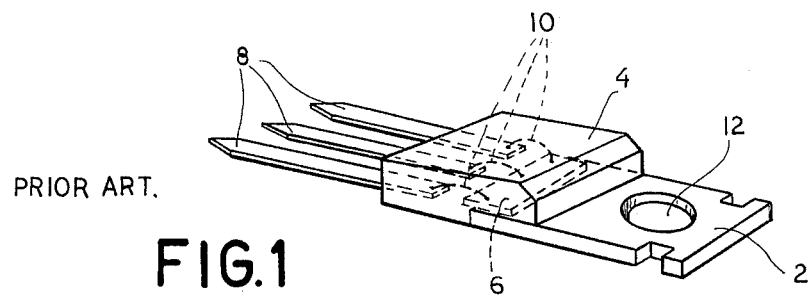
FIG. 1 is an enlarged perspective view of a package of the type TO-220 referred to above.
Figure 2:
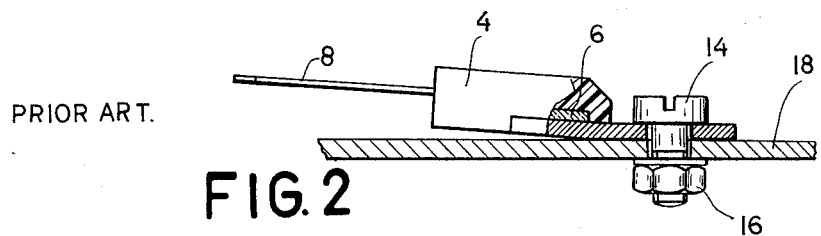
FIG. 2 is an elevational view, partly in section, of the device of FIG. 1 mounted on a heat sink.

In FIGS. 1 and 2 I have shown a conventional power-frame package comprising a metal strip 2 which is partly embedded in a block 4 of synthetic resin in whose interior the strip is overlain by an IC chip 6 of semiconductor material such as silicon. A power frame partly encased by the resin comprises a plurality of conductors 8, here three in number, which are connected to respective chip electrodes by leads 10 within block 4 and project from that block on the side opposite strip 2.

The exposed portion of strip 2 has a hole 12 for the passage of a screw 14 which also traverses a highly heat-conductive plate 18, e.g. of copper or aluminum, serving as a heat sink. The screw 14 is engaged by a nut 16 which, upon tightening, firmly attaches the exposed strip portion to the plate 18 but has the undesired effect of elevating the opposite end of the strip together with the resin block 4 out of contact with heat sink 18; this has been illustrated, in exaggerated form, in FIG. 2.

Figure 3:
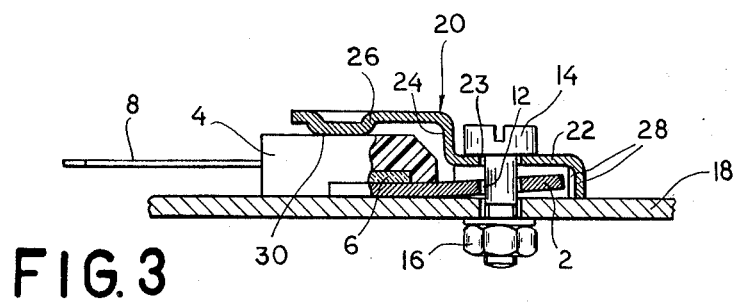
FIG. 3 is a view similar to FIG. 2, showing the same package engaged by a clamp according to my invention.
Figure 4:
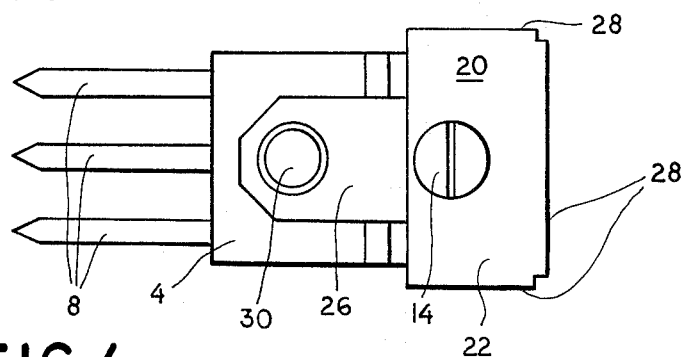
FIG. 4 is a top view of the assembly shown in FIG. 3.

In accordance with my present invention, and as shown in FIGS. 3 and 4, a clamp 20 is used to maintain the bare lower surface of the embedded portion of metal strip 2 in contact with plate 18 in order to provide the shortest possible flow path for the thermal flux generated within the package. The clamp 20 has a body of resilient sheet metal, e.g. brass, which forms a base 22 spacedly overlying the plate 18 and the exposed portion of strip 2. The rectangular base portion 22 is bent down on three sides to form legs 28 resting on the plate surface, thereby defining a space which is substantially closed on three sides and is open on the fourth side toward block 4. At this fourth side clamp forms a stepped tongue integral with the base, this tongue having a substantially vertical rising part 24 and a substantially horizontal extremity 26 spacedly overlying the upper surface of block 4 except for a downward projection 30 bearing upon that block under pressure of screw 14. The latter, in this instance, passes through an aperture 23 of base 22 aligned with the hole 12 of strip 2 which it traverses with clearance in order to let the exposed strip portion flex freely upwardly, allowing the remainder of the strip to lie flat against plate 18. Thus, the heat generated around IC chip 6 flows directly through the embedded strip portion into the heat sink 18.

The projecting portion or tail of strip 2, through its loose engagement with screw 14, helps maintain the position of the package on plate 18 but no longer dissipates significant amounts of heat. If other positioning means are provided, or if the clamping pressure of the cantilevered tongue 24, 26 is sufficient, this tail may therefore be eliminated.

In a specific embodiment, in which the thickness of block 4 is about 5 mm, the body of clamp 20 may have a thickness between 1 and 2 mm. With the thickness of strip 2 amounting to 1.3 mm, the lower surface of base 22 may be separated from the supporting surface of plate 18 by a distance of about 1.7 mm. The distance between tongue extremity 26 and plate 18 may be about 5.5 mm, with projection 30 extending about 0.7 mm below that extremity so that its distance from the level of the lower ends of legs 28 is slightly less than the thickness of block 4 prior to assembly. Projection 30 may be formed in the tongue by stamping.

While the use of a screw 14 as a fastener is advantageous because of the easy adjustability of the clamping pressure, other fastening means such as a rivet could be employed in some instances.

I claim:

1. In combination, a thermally conductive plate, a semi-conductor device resting on said plate in heat-transmitting contact therewith, and a clamp securing said device to said plate;

said device comprising a lead frame embedded in a four-sided resinous block and connected within said block to an IC chip, said chip being in contact with a metallic strip which has a plate-contacting lower surface substantially flush with the underside of said block, said device further including a set of conductors electrically connected to said frame and provided with elongate portions projecting from one side of said block remote from said strip;

said clamp comprising a body of resilient sheet metal forming a four-sided base offset from said block with legs bent down on three sides of said base to rest on said plate on a side of said block opposite said remote side thereof, said body being further provided with a stepped tongue extending integrally from the fourth side of said base toward said remote side of said block, said tongue having a rising part substantially perpendicular to said base at said fourth side and a free extremity substantially parallel to said base, the latter having an aperture traversed by a fastener engaging said plate, said extremity overlying said block in cantilevered fashion and having a downward projection bearing upon said block for holding said strip in firm contact with said plate.

2. The combination defined in claim 1 wherein said legs include one leg parallel and two legs perpendicular to said remote side of said block.

3. The combination defined in claims 1 or 2 wherein said strip extends from said fourth side into the space bounded by said legs and has a hole in line with said aperture, said fastener passing with clearance through said hole.

4. The combination defined in claim 3 wherein said fastener is a screw.

5. The combination defined in claim 1 or 2 wherein the distance between said tongue and the level of the lower ends of said legs is less, by a fraction of a millimeter, than the thickness of said block prior to engagement of said block by said tongue and in the absence of said fastener.

* * * * *